(12) United States Patent
Bao et al.

(10) Patent No.: US 9,818,746 B2
(45) Date of Patent: Nov. 14, 2017

(54) STRUCTURE AND METHOD TO SUPPRESS WORK FUNCTION EFFECT BY PATTERNING BOUNDARY PROXIMITY IN REPLACEMENT METAL GATE

(71) Applicant: International Business Machines Corporation, Armonk, NY (US)

(72) Inventors: Ruqiang Bao, Wappingers Falls, NY (US); Unoh Kwon, Fishkill, NY (US); Kai Zhao, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/994,650

(22) Filed: Jan. 13, 2016

(65) Prior Publication Data
US 2017/0200719 A1    Jul. 13, 2017

(51) Int. Cl.
| | | |
|---|---|---|
| H01L 21/70 | (2006.01) | |
| H01L 27/092 | (2006.01) | |
| H01L 29/49 | (2006.01) | |
| H01L 29/423 | (2006.01) | |
| H01L 21/8238 | (2006.01) | |
| H01L 29/51 | (2006.01) | |
| H01L 29/66 | (2006.01) | |

(52) U.S. Cl.
CPC .... *H01L 27/092* (2013.01); *H01L 21/823807* (2013.01); *H01L 21/823828* (2013.01); *H01L 29/42372* (2013.01); *H01L 29/4958* (2013.01); *H01L 29/4966* (2013.01); *H01L 29/517* (2013.01); *H01L 29/66545* (2013.01)

(58) Field of Classification Search
CPC .......... H01L 29/42372; H01L 29/4958; H01L 29/4966; H01L 29/517; H01L 29/66545; H01L 21/823807; H01L 21/823828; H01L 27/092
See application file for complete search history.

(56) References Cited

U.S. PATENT DOCUMENTS

| | | | |
|---|---|---|---|
| 7,528,451 B2 * | 5/2009 | Zhu | H01L 21/28044 257/385 |
| 8,183,644 B1 * | 5/2012 | Chuang | H01L 21/82387 257/369 |
| 8,592,296 B2 | 11/2013 | Ando et al. | |
| 8,597,995 B2 | 12/2013 | Xu | |

(Continued)

*Primary Examiner* — Shaun Campbell
(74) *Attorney, Agent, or Firm* — Cantor Colburn LLP; Steven Meyers

(57) ABSTRACT

A semiconductor device includes a first transistor formed on a substrate, the first transistor including a channel region positioned on the substrate; a second transistor formed on the substrate, the second transistor including a channel region positioned on the substrate; a high-k dielectric layer disposed on the channel region of the first transistor and the channel region of the second transistor; a first transistor metal gate positioned in contact with the high-k dielectric on the first transistor; a second transistor metal gate positioned in contact with the high-k dielectric on the second transistor; an oxygen absorbing barrier disposed in contact with the high-k dielectric between the first transistor and the second transistor; and a conductive electrode material disposed on the first transistor, the second transistor, and the oxygen absorbing barrier.

5 Claims, 18 Drawing Sheets

(56) References Cited

U.S. PATENT DOCUMENTS

| | | |
|---|---|---|
| 8,786,030 B2 | 7/2014 | Ando et al. |
| 9,059,244 B2 | 6/2015 | Cai et al. |
| 9,105,745 B2 | 8/2015 | Ando et al. |
| 2007/0284671 A1* | 12/2007 | Tsutsumi .......... H01L 21/28097 257/369 |
| 2008/0020535 A1 | 1/2008 | Gulari et al. |
| 2008/0157215 A1 | 7/2008 | Miyashita |
| 2010/0059827 A1* | 3/2010 | Oosuka ............. H01L 21/82345 257/369 |
| 2012/0280328 A1* | 11/2012 | Moriyama ........ H01L 21/28123 257/369 |
| 2014/0124876 A1 | 5/2014 | Kim et al. |
| 2015/0102453 A1 | 4/2015 | Cai et al. |
| 2016/0163603 A1* | 6/2016 | Bao ................. H01L 21/823842 257/412 |

\* cited by examiner

STRUCTURE AND METHOD TO SUPPRESS WORK FUNCTION EFFECT BY PATTERNING BOUNDARY PROXIMITY IN REPLACEMENT METAL GATE

BACKGROUND

The present invention relates to complementary metal oxide semiconductor (CMOS), and more specifically, to replacement metal gate structures and process flows.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

When a MOSFET is scaled down through various technology nodes, several techniques are employed to improve device performance. One technique includes using a high-k dielectric material and replacement metal gate scheme.

SUMMARY

According to an embodiment, a semiconductor device includes a first transistor formed on a substrate, the first transistor including a channel region positioned on the substrate; a second transistor formed on the substrate, the second transistor including a channel region positioned on the substrate; a high-k dielectric layer disposed on the channel region of the first transistor and the channel region of the second transistor; a first transistor metal gate positioned in contact with the high-k dielectric on the first transistor; a second transistor metal gate positioned in contact with the high-k dielectric on the second transistor; an oxygen absorbing barrier disposed in contact with the high-k dielectric between the first transistor and the second transistor; and a conductive electrode material disposed on the first transistor, the second transistor, and the oxygen absorbing barrier.

According to another embodiment, a semiconductor device includes an nFET formed on a substrate, the nFET including a channel region positioned on the substrate; a pFET formed on the substrate, the pFET including a channel region positioned on the substrate; a high-k dielectric layer disposed on the channel region of the nFET and the channel region of the pFET; an nFET metal gate positioned in contact with the high-k dielectric on the nFET; a pFET metal gate positioned in contact with the high-k dielectric on the pFET; an oxygen absorbing barrier disposed between the nFET and the pFET and in contact with the high-k dielectric; and a conductive electrode material disposed on the nFET metal gate and the pFET metal gate; wherein the oxygen absorbing barrier extends from a surface of the conductive electrode material to the high-k dielectric between the nFET and the pFET.

Yet, according to another embodiment, a method of making a semiconductor device includes forming a first transistor channel region and a second transistor channel region on a substrate; disposing a high-k dielectric on the first transistor channel region and the second transistor channel region; forming a first transistor metal gate on the high-k dielectric on the first transistor; forming a second transistor metal gate on the high-k dielectric on the second transistor; depositing an oxygen absorbing barrier between the first transistor and the second transistor, the oxygen absorbing barrier positioned in contact with the high-k dielectric between the first transistor and the second transistor; and depositing a conductive electrode material on the first transistor and the second transistor to form a gate.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 3-11 illustrate exemplary methods of making semiconductor devices according to an embodiment, in which:

FIG. 3 is a cross-sectional side view after forming a trench over a first transistor and a second transistor in an inter-layer dielectric (ILD) and depositing a high-k in the trench;

FIG. 4 is a cross-sectional side view after disposing a first transistor gate stack within the trench;

FIG. 5 is a cross-sectional side view after removing the first transistor gate stack from the second transistor;

FIG. 6 is a cross-sectional side view after depositing the second transistor gate stack in the trench;

FIG. 7 is a cross-sectional side view after disposing a sacrificial material in the trench and forming an opening between the first and second transistors;

FIG. 8 is a cross-sectional side view after removing the sacrificial material to expose the high-k material between the transistors;

FIG. 9 is a cross-sectional side view after disposing an oxygen absorbing barrier stack between the transistors;

FIG. 10 is a cross-sectional side view after disposing a conductive electrode material in the trench over the oxygen absorbing barrier stack; and FIG. 11 is a cross-sectional side view after performing a planarization process;

FIGS. 12-17 illustrate exemplary methods of making semiconductor devices according to another embodiment that follows FIG. 6, in which:

FIG. 12 is a cross-sectional side view after disposing a conductive electrode material over the second transistor gate stack of FIG. 6;

FIG. 13 is a cross-sectional side view after performing a planarization process;

FIG. 14 is a cross-sectional side view after disposing a mask on the conductive electrode material and patterning the mask to form an opening between the transistors;

FIG. 15 is a cross-sectional side view after transferring the pattern from the mask to expose the high-k dielectric between the transistors;

FIG. 16 is a cross-sectional side view after depositing the oxygen absorbing barrier material in the opening between the transistors; and FIG. 17 is a cross-sectional side view after performing a planarization process.

DETAILED DESCRIPTION

In a replacement metal gate scheme, threshold voltage of the nFET and pFET can be set by modulating the oxygen vacancy creation in the high-k dielectric by metal gate stack. This can be achieved by using proper work function metals that can either create or preserve oxygen vacancies. For instance, an nFEt metal gate stack may include an oxygen scavenger/absorber, which creates an oxygen vacancy in the high-k dielectric and defines the nFET threshold voltage (Vt). The high-k dielectric under the nFET metal gate is thus oxygen depleted. In contrast, the high-k material under pFET metal can be oxygen rich to set the necessary pFET threshold voltage (Vt). Due to the difference in oxygen concentration between the transistors, oxygen may diffuse into the high-k material of the nFET when the nFET and pFET share a metal gate. As a result, the nFET threshold voltage increases if the pFET metal gate approaches the nFET. By contrast, when the nFET metal gate that includes an oxygen absorber approaches the pFET, the pFET threshold voltage increases.

Figure 1:
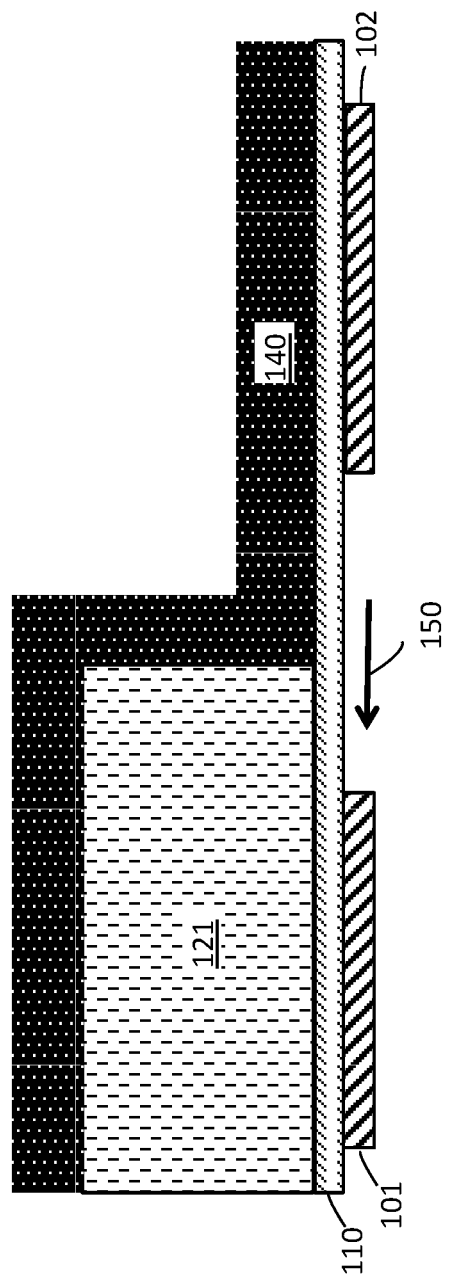
FIG. 1 is a cross-sectional side view of a comparative semiconductor device with an oxygen absorbing transistor stack adjacent to an oxygen providing transistor stack.

For example, as shown in FIG. 1, an nFET 101 and a pFET 102 are formed on a substrate. The nFET 101 and pFET 102 include channel regions that are positioned on or within the substrate. A high-k dielectric 110 is formed on the channel regions of the nFET 101 and the pFET 102. An nFET metal gate 121 is deposited on the high-k dielectric 110 over the nFET 101. A pFET metal gate 140 is positioned in contact with the high-k dielectric 110 on the pFET 102. The pFET metal gate 140 can also be deposited on the nFET metal gate 121 and between the nFET 101 and pFET 102. The sequence of forming nFET and pFET metal on the nFET 101 and the pFET 102 can be reversed. Because the pFET gate stack 140 is an oxygen provider, and the nFET gate stack 121 is an oxygen absorber, an oxygen concentration gradient is created between the transistors, and oxygen flows/diffuses through the high-k dielectric 110 in the direction 150 from the pFET 102 to the nFET 101.

Accordingly, various embodiments described herein provide semiconductor devices and methods of making semiconductor devices that suppress the above described effects shown in FIG. 1 between transistors when a replacement metal gate scheme is used. To mitigate oxygen diffusion between a pFET and an nFET, a boundary is patterned and formed between the transistors. The boundary includes a mild oxygen absorber that reduces the oxygen concentration difference between the nFET and the pFET. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 2:
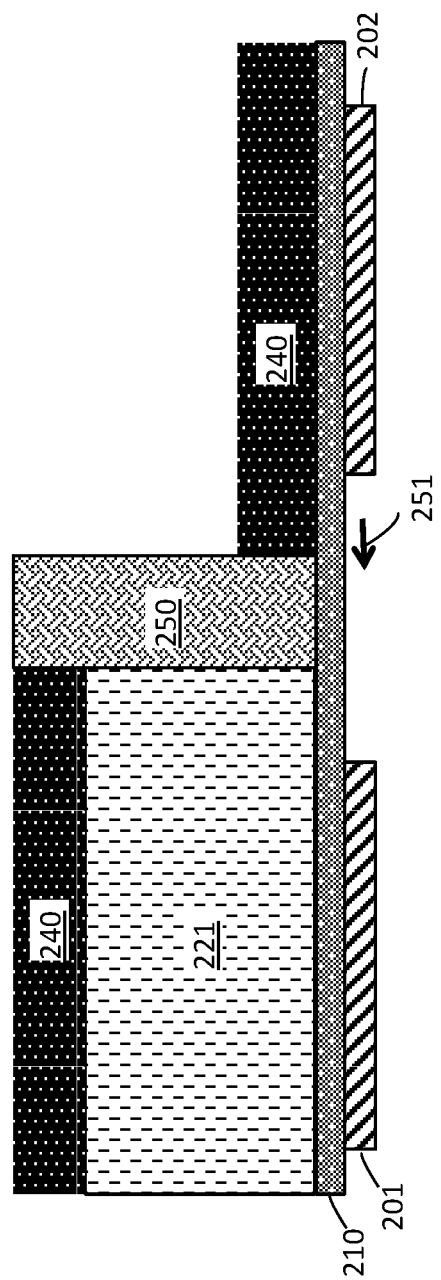
FIG. 2 is a cross-sectional side view of a semiconductor device according to various embodiments, in which an oxygen absorbing barrier is positioned between the oxygen absorbing transistor stack and an oxygen providing transistor stack.

FIG. 2 is a cross-sectional side view of a semiconductor device with an oxygen absorbing barrier 250 positioned between an oxygen absorbing metal gate stack 221 of an nFET 201 and an oxygen providing metal gate stack 240 of a pFET 202 according to various embodiments. The nFET 201 and the pFET 202 include channel regions that are positioned on a substrate.

Methods for making the semiconductor devices are described in further detail below. The oxygen absorbing metal gate stack 221 (nFET stack) and the oxygen providing metal gate 202 (pFET stack) are not limited to these transistors and may be any gate stacks that create an oxygen gradient. Likewise, the nFET 201 and pFET 202 may be any other adjacent transistors.

A high-k dielectric 210 is formed on the nFET 201 and the pFET 202. The nFET metal gate 221 is positioned on the high-k dielectric 210 over the nFET 201. The pFET metal gate 240 is positioned in contact with the high-k dielectric 210 on the pFET 202. The pFET metal gate 240 can also be disposed on the nFET stack 221. The oxygen absorbing barrier 250 is formed between the nFET 201 and the pFET 202. The oxygen absorbing barrier 250 includes an oxygen absorber that separates the nFET 201 and the pFET 202 in the shared gate scheme. The oxygen absorbing barrier 250 reduces the oxygen concentration gradient between the nFET 201 (low oxygen concentration) and the pFET 202

(high oxygen concentration). Oxygen diffusion through the high-k dielectric 210 in the direction 251 is reduced, compared to FIG. 1.

Figure 3:
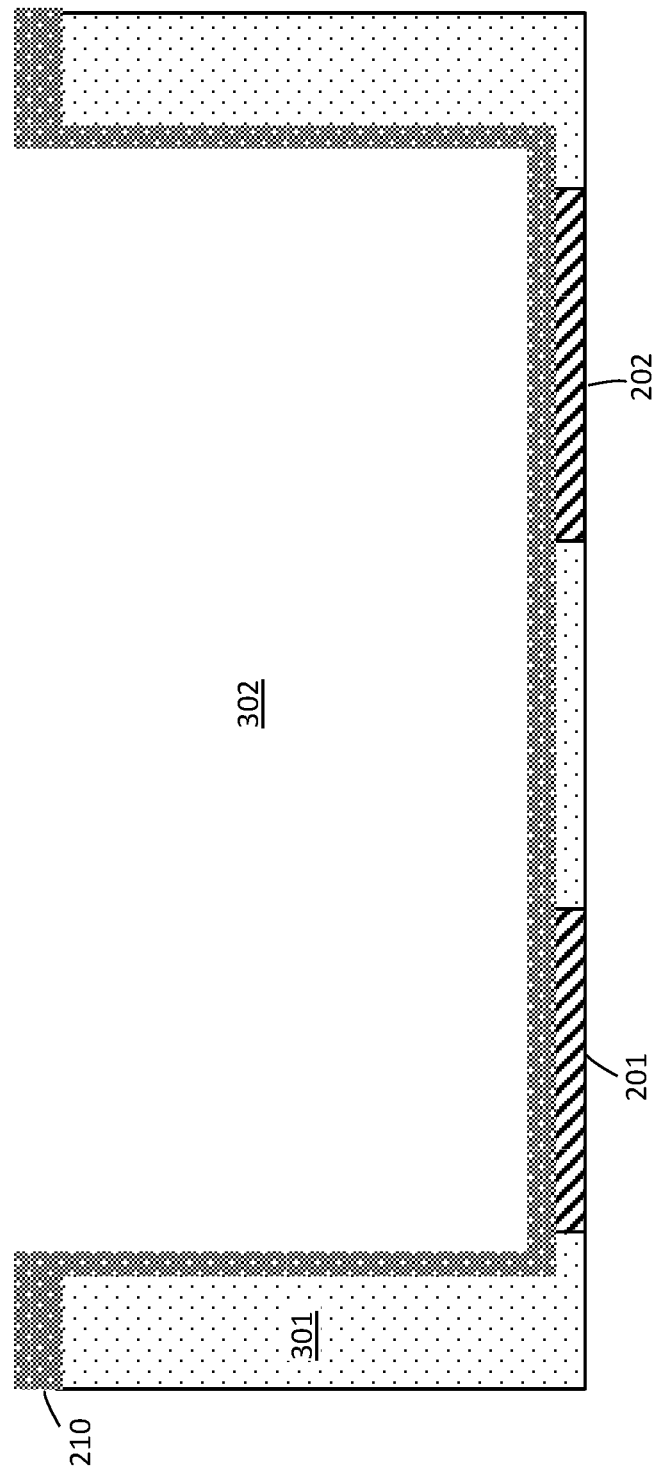

FIGS. 3-11 illustrate exemplary methods of making semiconductor devices according to an embodiment of the invention. FIG. 3 is a cross-sectional side view after forming a trench 302 over an nFET 201 (first transistor) and a pFET 202 (second transistor) in an inter-layer dielectric (ILD) 301 and depositing a high-k dielectric 210 in the trench 302 on the nFET 201 and the pFET 202.

The nFET 201 and the pFET 202 may be formed on a substrate. The substrate material may differ between the nFET 201 and the pFET 202. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), aluminum arsenide (AlAs)), or any combination thereof. Other examples of suitable substrates include silicon-on-insulator (SOI) substrates and silicon-germanium on insulator substrates with buried oxide (BOX) layers.

The nFET 201 and the pFET 202 may include epitaxial growth formed by an epitaxial growth process on the substrate. Epitaxial growth may be grown using, for example, vapor-phase epitaxy (VPE), molecular-beam epitaxy (MBE), liquid-phase epitaxy (LPE), or other suitable process. The epitaxial growth may be doped with an n-type dopant (e.g., phosphorus or arsenic) for the nFET 201 or a p-type dopant (e.g., boron or gallium) for the pFET 202. In other embodiments, the nFET 201 and the pFET 202 may include dopants that are introduced into the substrate.

Before metal gate deposition, a trench 302 is formed in an ILD 301. The trench 302 is formed after removing a sacrificial gate material (dummy gate material), for example, polysilicon, from the ILD 301. The sacrificial gate material may be removed by performing a dry etch process, for example, a reactive ion etch (RIE), followed by a wet etch process.

The ILD 301 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 301 may be deposited by a deposition process, including, but not limited to CVD, PVD, plasma enhanced CVD, atomic layer deposition (ALD), evaporation, chemical solution deposition, or like processes.

An interfacial layer (not shown) may be formed in the trench 302 on the nFET 201 and pFET 202 beneath the high-k dielectric 210. The interfacial layer may include a silicon oxide ($SiO_2$) layer. Alternatively, the interfacial layer may optionally include HfSiO or SiON. The interfacial layer may be formed by, for example, atomic layer deposition (ALD), chemical vapor deposition (CVD), thermal oxidation, wet oxidation, radical oxidation (RadOx), or combinations thereof.

The high-k dielectric 210 is disposed in the trench 302 on the interfacial layer as a conformal layer that contacts the nFET 201, the pFET 202, and sidewalls of the trench 302. The high-k dielectric 210 may be a dielectric material having a dielectric constant greater than 3.9, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The thickness of the high-k dielectric 210 may be in a range from about 0.5 to about 3 nm. In some embodiments, the thickness of the high-k dielectric 210 is in a range from about 1 to about 2 nm.

Figure 4:
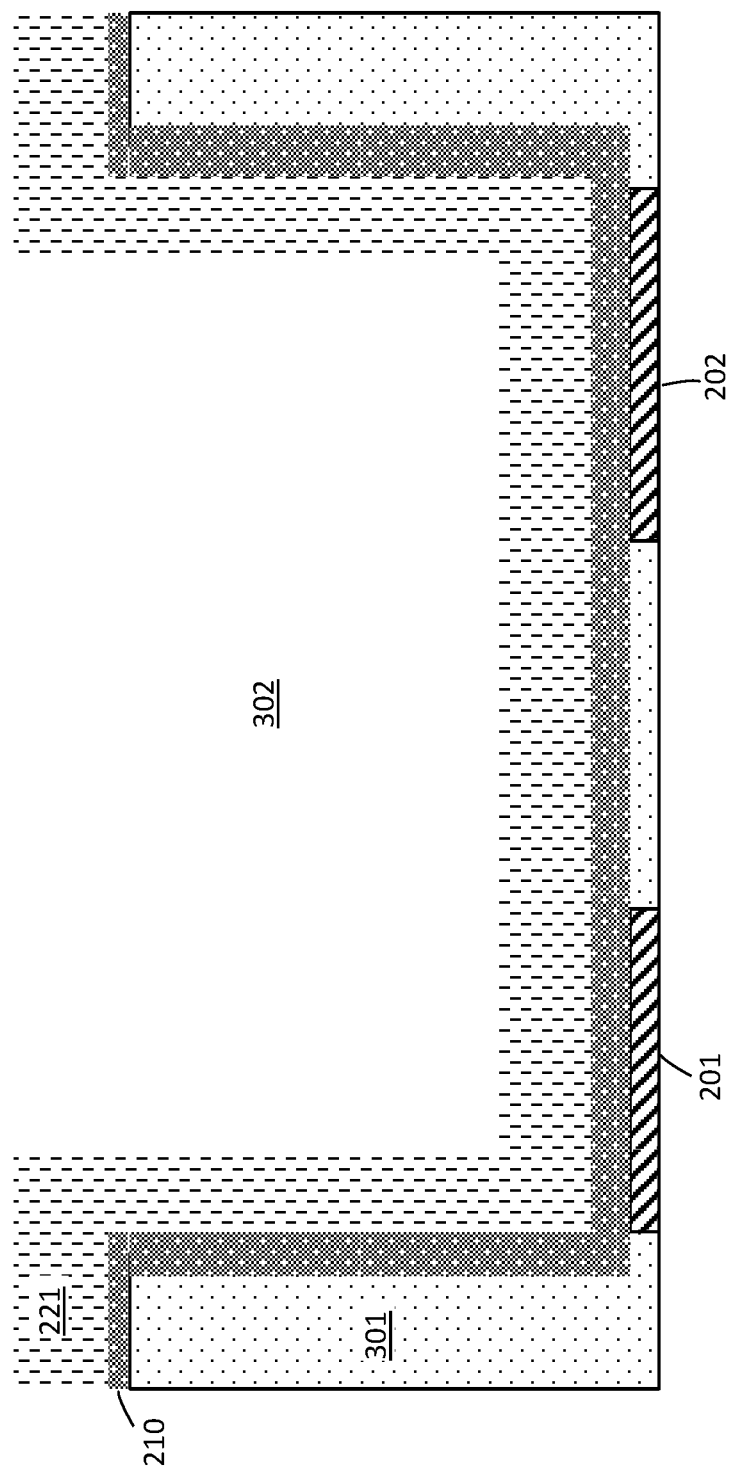

FIG. 4 is a cross-sectional side view after disposing the nFET metal gate 221 (first transistor gate stack) within the trench 302. The nFET metal gate 221 is disposed on the high-k dielectric 210.

The nFET metal gate 221 may include a single metal layer or multi-metal layer structure with a sufficiently low effective work function value. The nFET metal gate 221 may be, for example, a conductive transition metal nitride or a conductive transition metal carbide or the combination of both. The nFET metal gate 221 may be selected from TiN, TiC, TaN, TaC, Al, TiAl, Ti, Ni, Nb or a combination thereof. The nFET metal gate 221 may include any other high oxygen absorbing metals. In some embodiments, the thickness of the nFET metal gate layer 221 is in a range from about 1 nm to about 100 nm. In other embodiments, the thickness of the first metal compound layer 220 is in a range from about 1 to about 10 nm.

The nFET metal gate 221 may be formed using, for example, chemical vapor deposition (CVD), physical vapor deposition (PVD), or atomic layer deposition (ALD). The nFET metal gate 221 can contain element to absorb oxygen from neighboring metallic layers during subsequent processing. The nFET metal gate 221 may include a metal in an elemental form. The metal of the oxygen absorbing layer may be, but is not limited to, Al, Be, Mg, Ca, Sr, Ba, Sc, Y, La, Ti, Zr, Hf, Dy, Lu, Er, Pr, and Ce. In an exemplary embodiment, the nFET metal gate layer 221 includes a transition metal carbide. In one embodiment, the nFET metal gate layer 221 includes at least one alkaline earth metal. In another embodiment, the nFET metal gate layer 221 includes at least one transition metal. In yet another embodiment, the nFET metal gate layer 221 includes a mixture of at least one alkaline earth metal and at least one transition metal.

Figure 5:
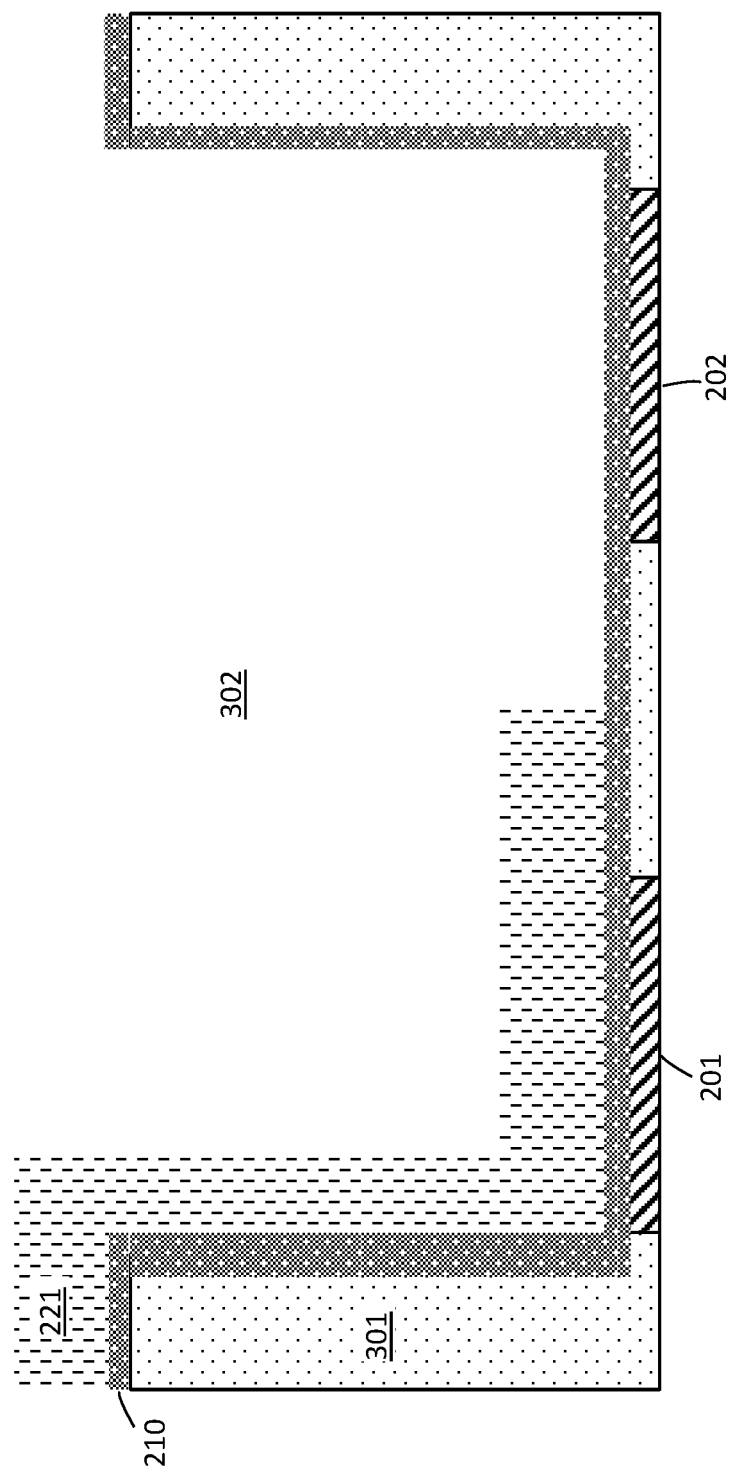

FIG. 5 is a cross-sectional side view after patterning to remove the first transistor metal gate 221 from the second transistor (pFET 202) side. The high-k dielectric 210 is exposed over the pFET 202.

The patterning may be performed by lithography and etching. A mask, such as a photoresist, may be disposed on the nFET metal gate 221 on the nFET 201 and pFET 202. The photoresist may be patterned by exposing to the desired pattern of radiation. Then the exposed photoresist may be developed with a resist developer to provide a patterned photoresist. The photoresist pattern may expose the pFET 202 region, and the nFET metal gate 221 may be removed by etching through the nFET metal gate 221 over the pFET 202. After etching to remove the nFET metal gate 221 over the pFET 202, the mask may be removed.

Figure 6:
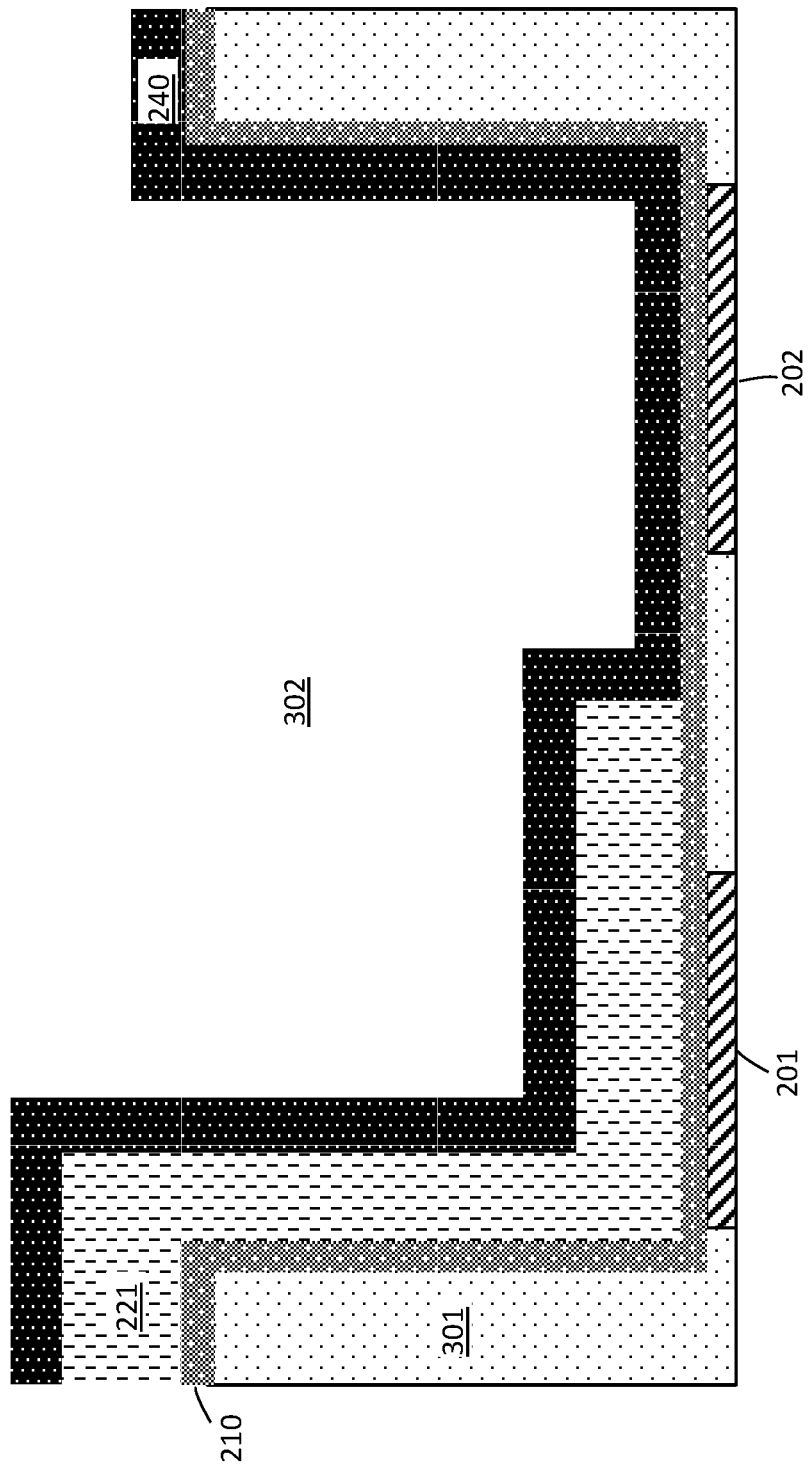

FIG. 6 is a cross-sectional side view after depositing the second transistor metal gate 240 in the trench 302. The pFET metal gate 240 contacts the nFET metal gate 221 and the high-k dielectric 210 over the pFET 202. The pFET metal gate 240 (second transistor gate stack) may include an oxygen providing material or a weak oxygen scavenger. The pFET metal gate 240 may include a single metal layer or multi-metal layer structure with a sufficiently high effective work function value. Non-limiting examples of materials for the pFET metal gate 240 include TiN, TaN, Ru, Mo, Al, WN, or combinations thereof. The pFET metal gate 240 may be formed by, for example, ALD, PVD, CVD, or other suitable process. In some embodiments, the thickness of the pFET metal gate 240 is in a range from about 1 to about 100 nm. In other embodiments, the thickness of the pFET metal gate 240 is in a range from about 1 to about 10 nm.

Figure 7:
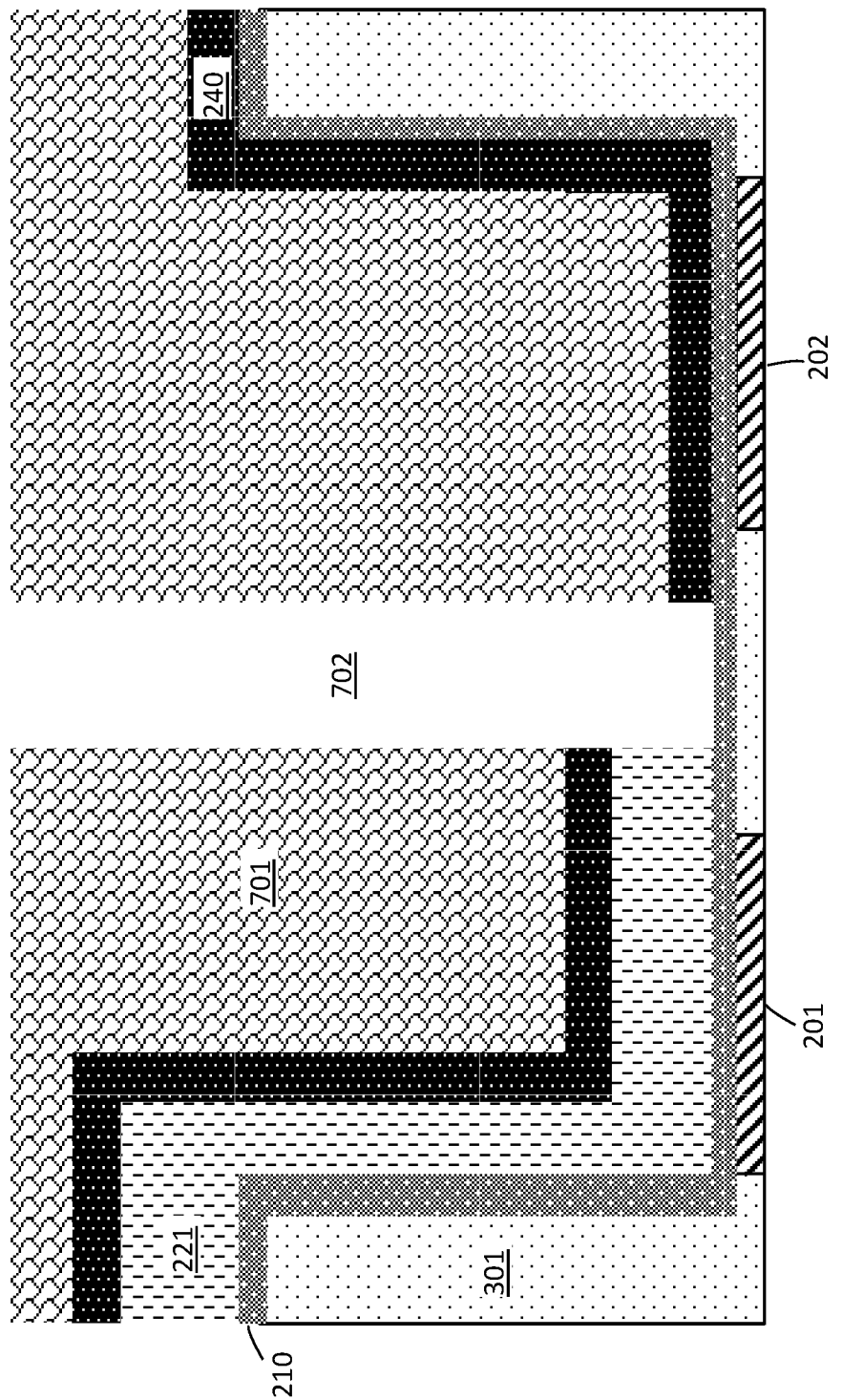

FIG. 7 is a cross-sectional side view after disposing a sacrificial material 701 in the trench 302 and forming an opening 702 between the first (nFET 201) and second transistors (pFET 202). The sacrificial material 701 contacts and covers the pFET metal gate 240 disposed over the nFET 201 and the pFET 202. The pFET metal gate 240 and the nFET metal gate 221 are removed beneath the opening 702. The opening 702 extends through the sacrificial material 701 down to the level of the high-k dielectric 210. The high-k dielectric 210 is exposed between the nFET 201 and the pFET 202.

The sacrificial material 701 may be, for example, C, $SiO_2$, or a photoresist. The sacrificial material 701 may be formed by, for example, CVD, PVD, ALD, or spin coating.

The opening 702 is formed in the sacrificial material 701 by performing an etch process, for example, a dry etch process (e.g., RIE). In some embodiments, the width of the opening 702 (trench) is in a range from about 1 to about 50 nm. In other embodiments, the width of the opening 702 is in a range from about 1 to about 10 nm.

Figure 8:
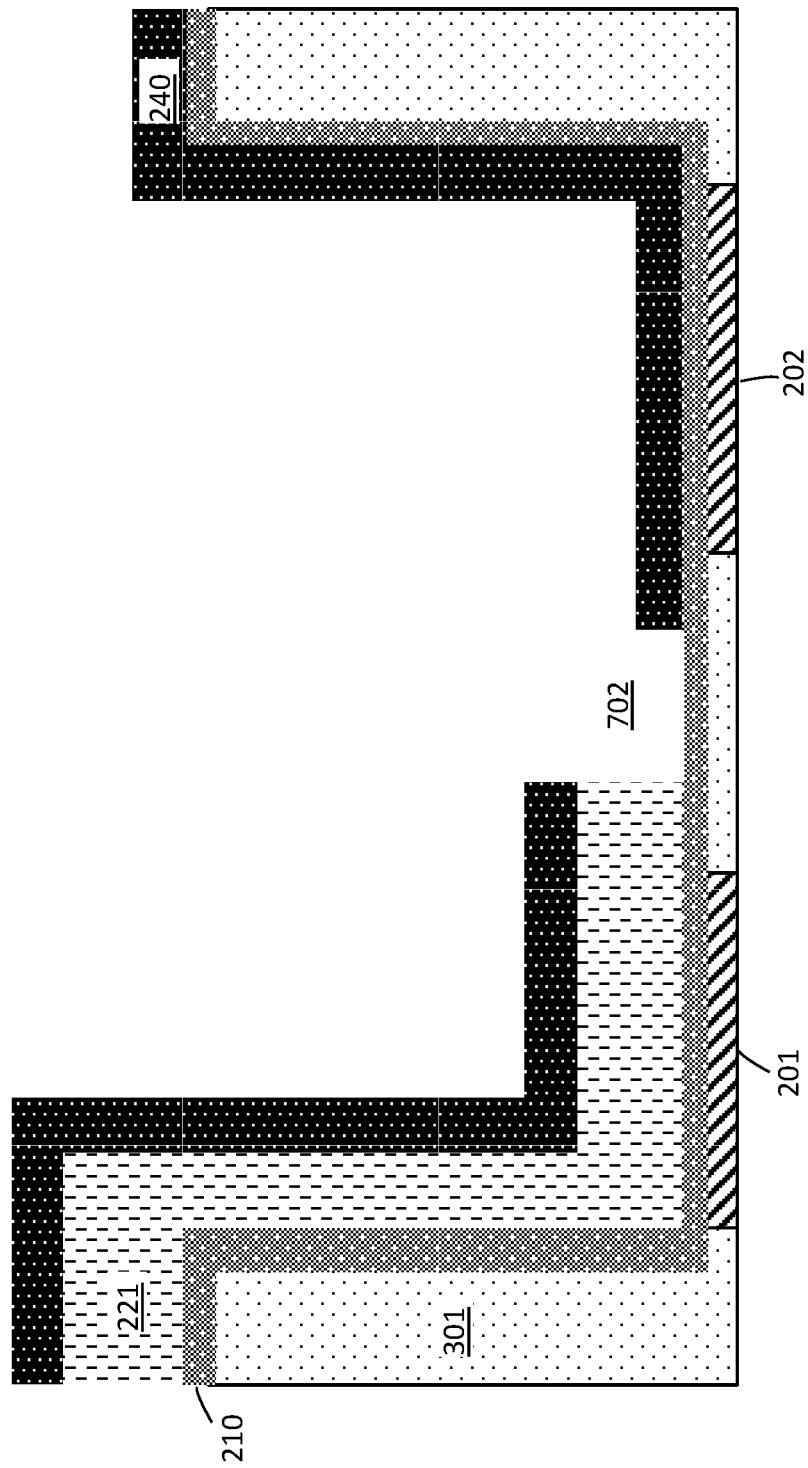

FIG. 8 is a cross-sectional side view after removing the sacrificial material 701 to expose the pFET metal gate 240 and the high-k dielectric 210 in the region between the nFET 201 and the pFET 202. The sacrificial material 701 (shown in FIG. 7) may be removed by performing an etch process, for example, ME, wet etching, or other processes.

Figure 9:
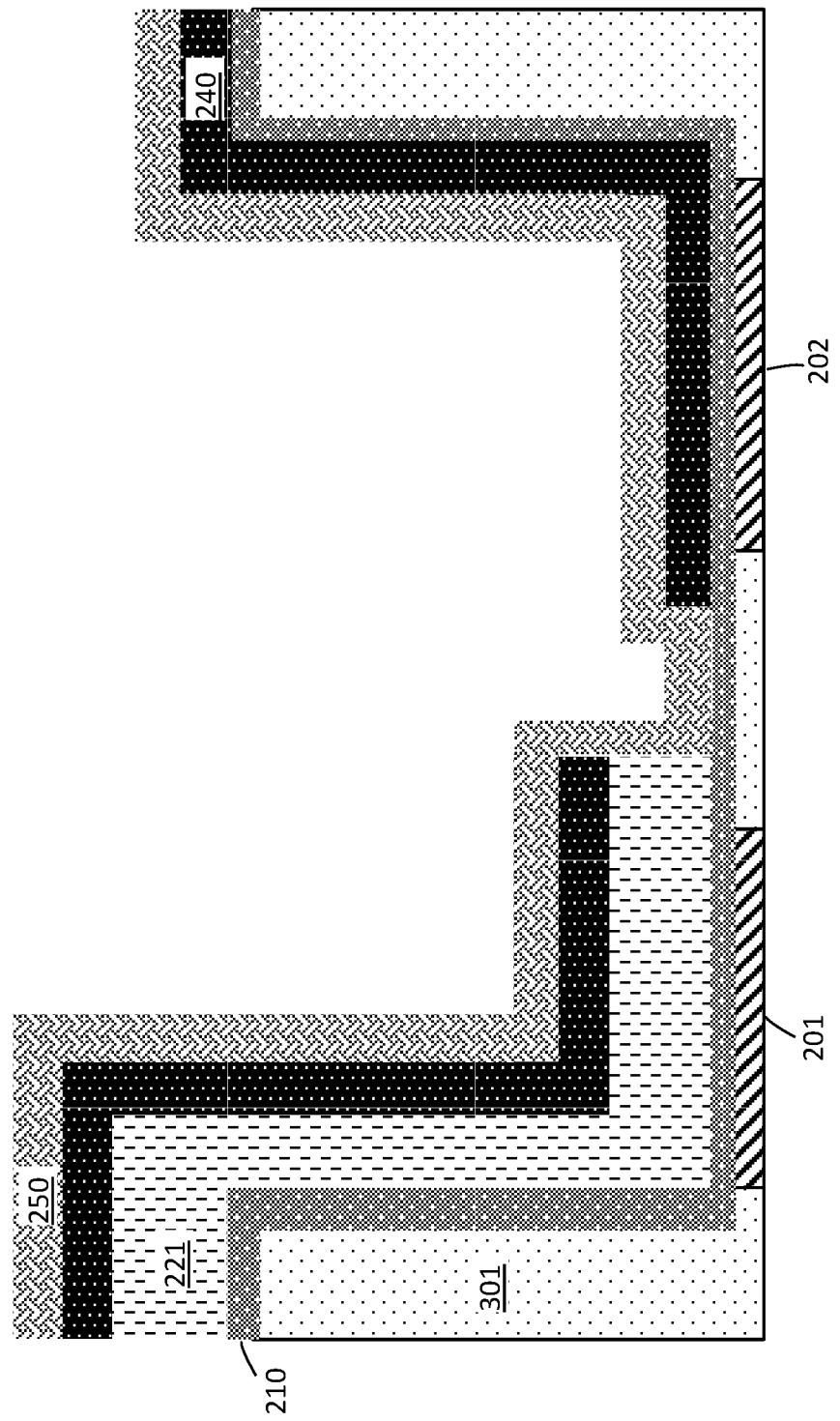

FIG. 9 is a cross-sectional side view after disposing an oxygen absorbing barrier 250 layer over the nFET 201 and the pFET 202. The oxygen absorbing barrier 250 layer contacts the pFET metal gate 240 and the high-k dielectric 210 between the nFET 201 and the pFET 202.

The oxygen absorbing barrier 250 may be formed by, for example, CVD, PVD, or ALD. The oxygen absorbing barrier 250 may be a mild oxygen scavenging/absorbing material or material layers. In one embodiment, the oxygen absorbing barrier 250 includes TiN, TiC, TiN, TiC, TaC, Ti, Al, TiAl, W, Ni, Nb, NbAl or any combination thereof. For example, the oxygen absorbing barrier 250 may be TiN/TiC/TiN, a thin layer of TiC, or a thin layer of TaC. The oxygen absorbing barrier 250 may include a metal in an elemental form. The metal of the oxygen absorbing barrier 250 may be, but is not limited to, Al, Be, Mg, Ca, Sr, Ba, Sc, Y, La, Ti, Zr, Hf, Dy, Lu, Er, Pr, and Ce. In one embodiment, the oxygen absorbing barrier 250 includes at least one alkaline earth metal. In another embodiment, the oxygen absorbing barrier 250 includes at least one transition metal. In yet another embodiment, the oxygen absorbing barrier 250 includes a mixture of at least one alkaline earth metal and at least one transition metal. In some embodiments, the thickness of the oxygen absorbing barrier 250 is in a range from about 1 to about 50 nm. In other embodiments, the thickness of the oxygen absorbing barrier 250 is in a range from about 1 to about 10 nm.

Figure 10:
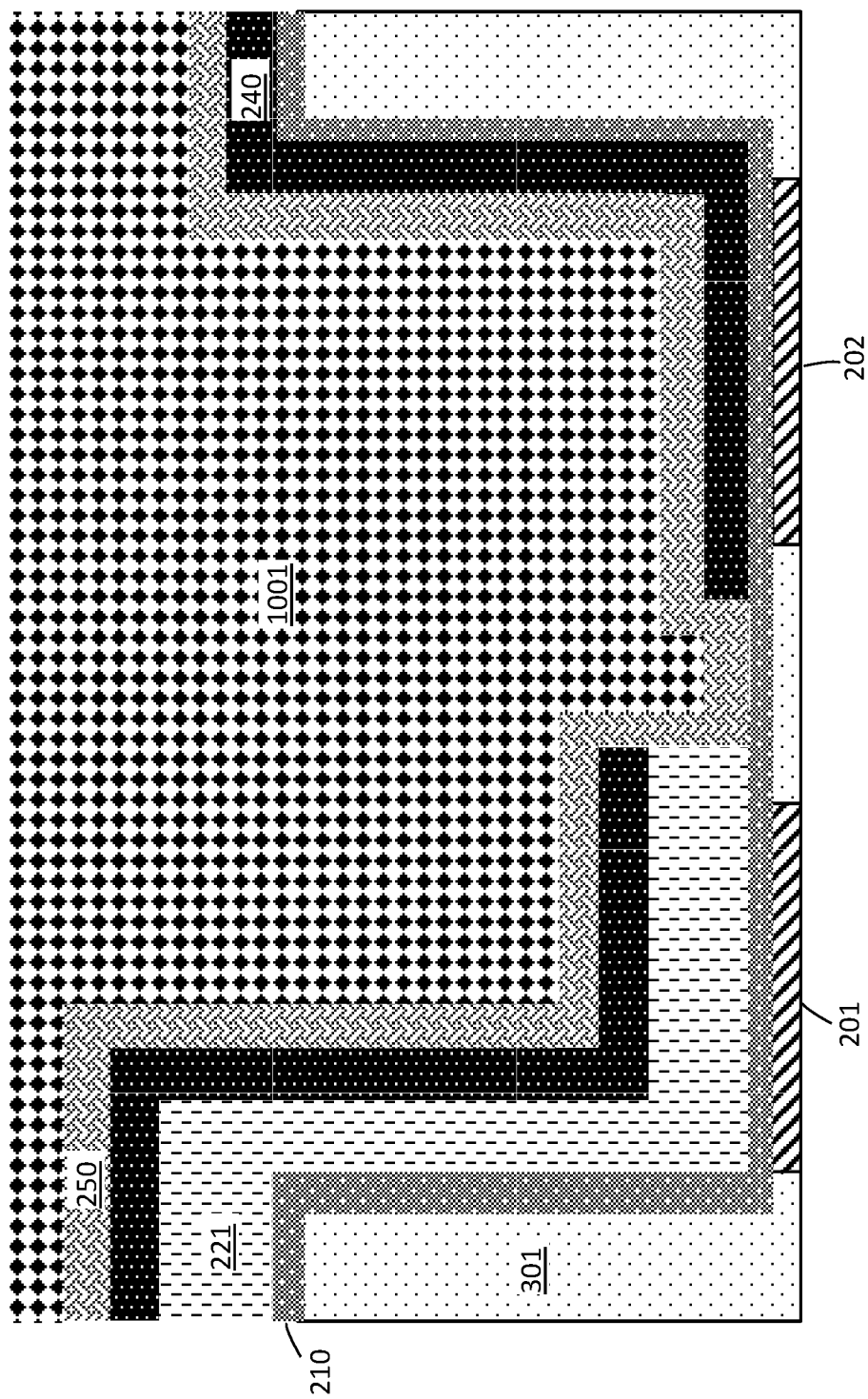

FIG. 10 is a cross-sectional side view after disposing a conductive electrode material 1001 on the oxygen absorbing barrier 250. The oxygen absorbing barrier 250 is positioned between the conductive electrode material 1001 and the pFET stack 240 over the nFET 201 and the pFET 202. The conductive electrode material 1001 covers the oxygen absorbing barrier 250.

The conductive electrode material 1001 may be deposited by, for example, CVD, PECVD, PVD, plating, thermal or e-beam evaporation, or sputtering. The conductive electrode material 1001 may include, but is not limited to, aluminum (Al), platinum (Pt), gold (Au), tungsten (W), titanium (Ti), or any combination thereof.

Figure 11:
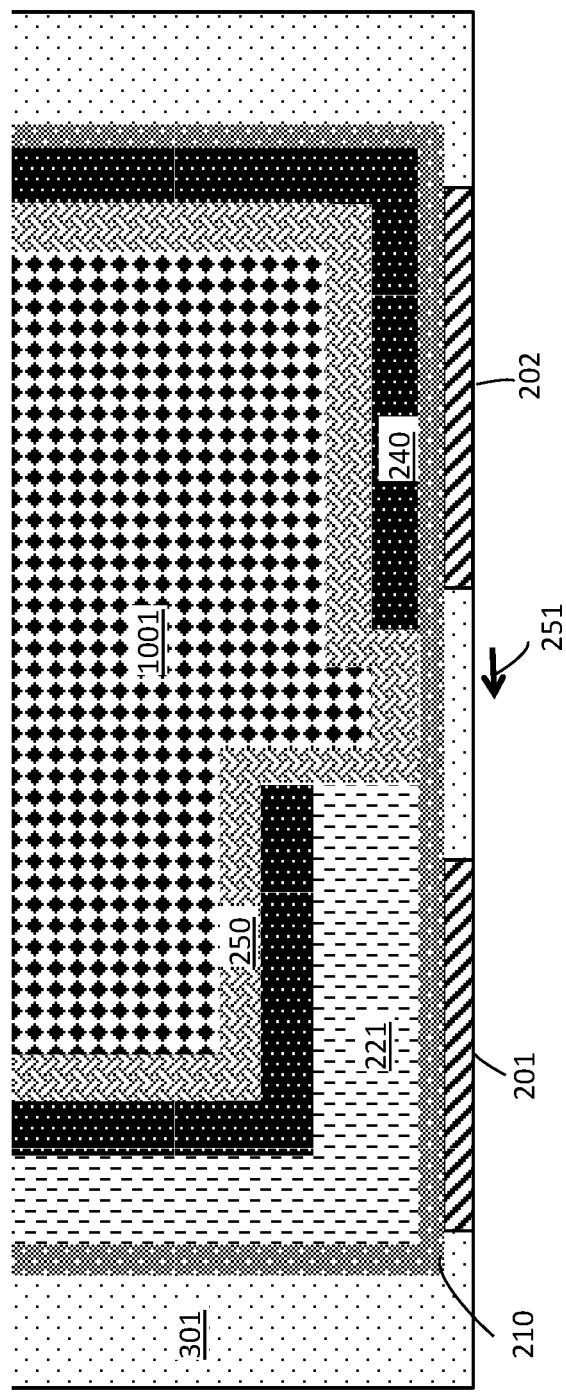

FIG. 11 is a cross-sectional side view after performing a planarization process. The planarization process may be, for example, a chemical mechanical planarization (CMP) process. The planarization process polishes down the surface of the conductive electrode material 1001, as well as the nFET metal gate 221 and pFET metal gate 240.

The oxygen absorbing barrier 250 separates the nFET 201 (first transistor) and the pFET 202 (second transistor). The oxygen absorbing separation barrier reduces oxygen diffusion from the pFET 202 to the nFET 201 (direction 251). In addition to being positioned between the nFET 201 and the pFET 202, the oxygen absorbing barrier 250 is also in contact with the pFET metal gate 240. The width of the oxygen absorbing barrier 250 is defined by the width of the trench 702, as shown and described in FIG. 7.

Figure 12:
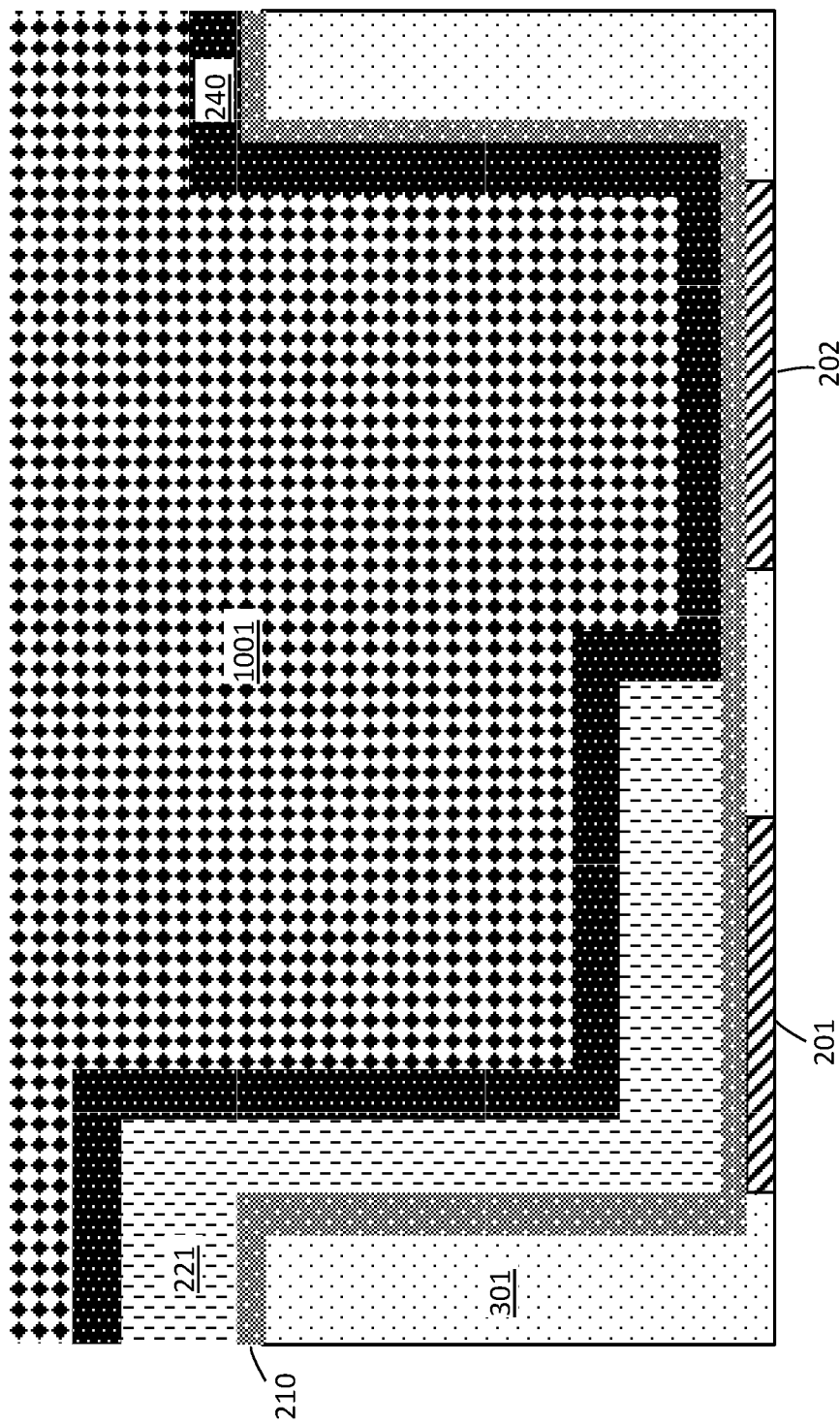

FIGS. 12-16 illustrate exemplary methods of making semiconductor devices according to another embodiment that follows FIG. 6. FIG. 12 is a cross-sectional side view after first disposing a conductive electrode material 1001 over the second transistor metal (pFET metal gate 240) of FIG. 6, instead of disposing and patterning the sacrificial material 701 as in the first embodiment (see FIG. 7). In the second embodiment, the conductive electrode material 1001 is deposited before the oxygen absorbing barrier 250.

Figure 13:
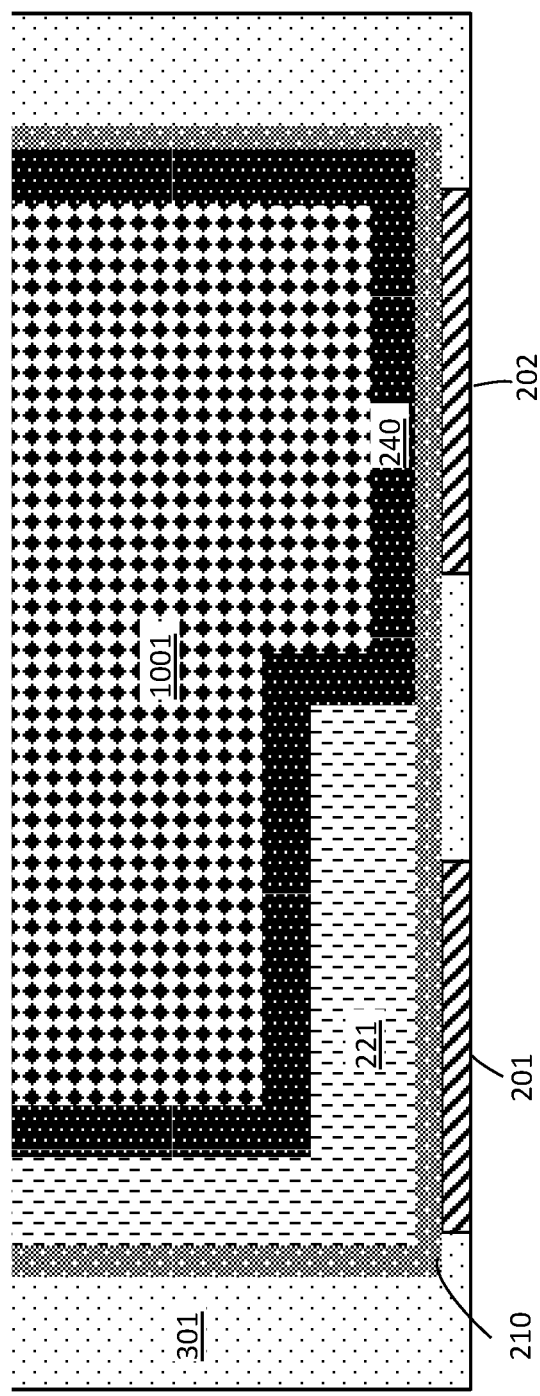

FIG. 13 is a cross-sectional side view after performing a planarization process, for example, a CMP process. The planarization process polishes down the surface of the conductive electrode material 1001, as well as the nFET metal gate 221 and pFET metal gate 240.

Figure 14:
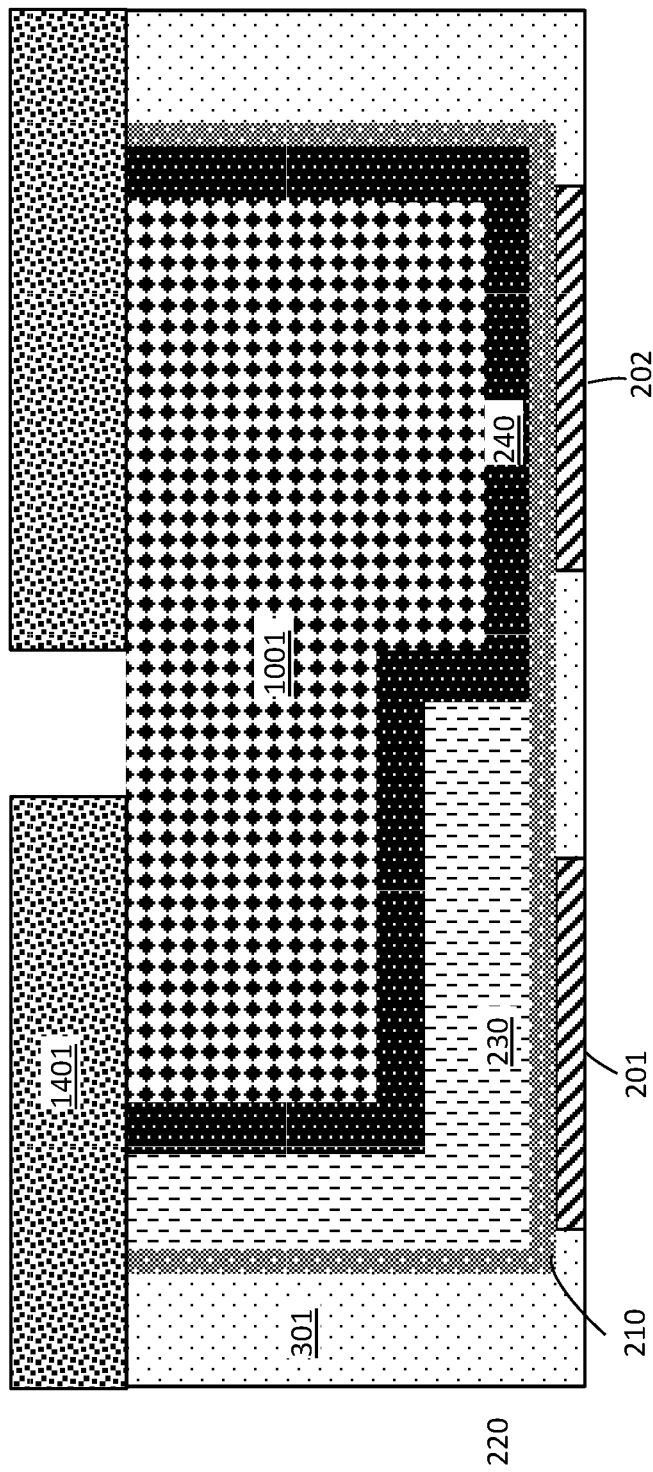

FIG. 14 is a cross-sectional side view after disposing a mask 1401 on the conductive electrode material 1001 and patterning the mask 1401. The mask 1401 may be, for example, a photoresist or a hard mask. The mask 1401 is patterned to form an opening between the nFET 201 and the pFET 202.

Figure 15:
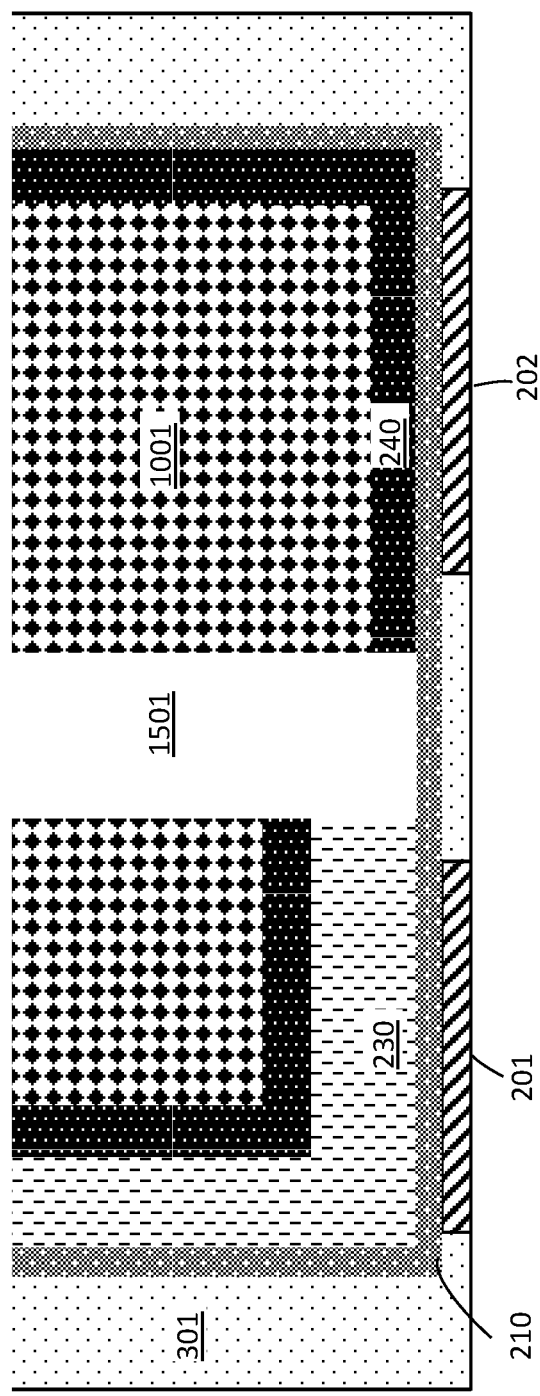

FIG. 15 is a cross-sectional side view after transferring the pattern from the mask 1401 to form an opening 1501 (trench) between the first transistor (nFET 201) and second transistor (pFET 202). The conductive electrode material 1001, the nFET metal gate 221, and the pFET metal gate 240 are removed between the nFET 201 and the pFET 202 to expose the high-k dielectric 210 in the region between the transistors. Then the mask 1401 is removed.

Figure 16:
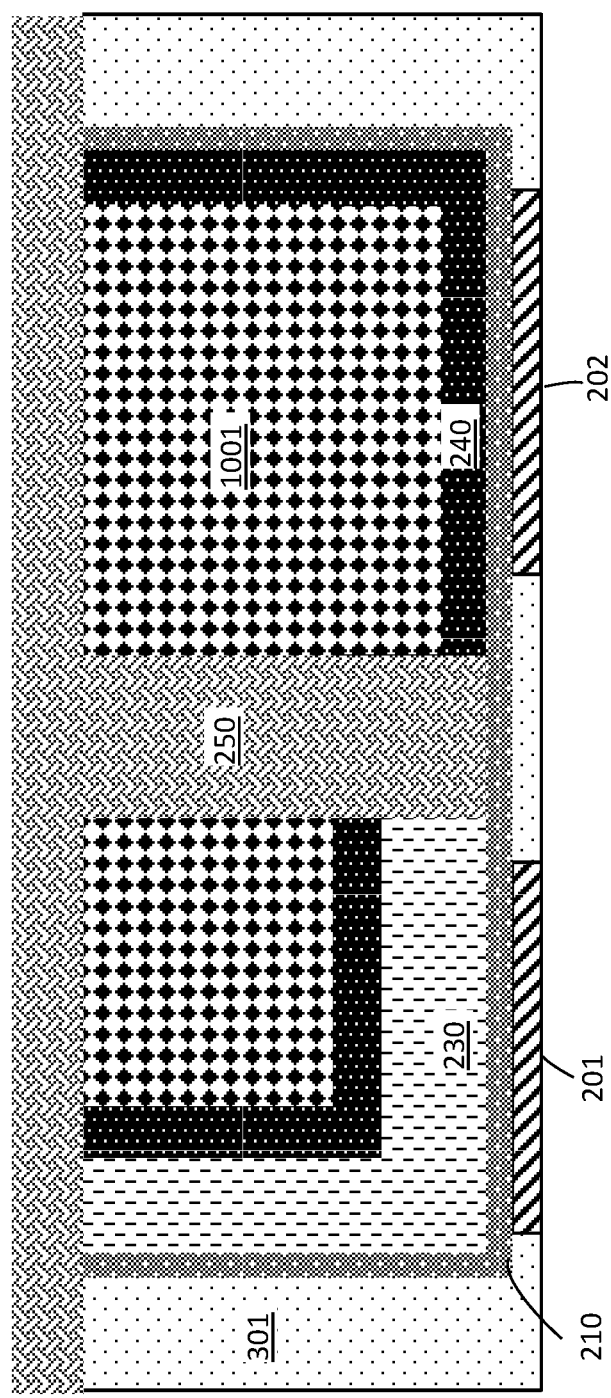

FIG. 16 is a cross-sectional side view after depositing the oxygen absorbing barrier 250 in the opening 1501 between the nFET 201 and the pFET 202.

Figure 17:
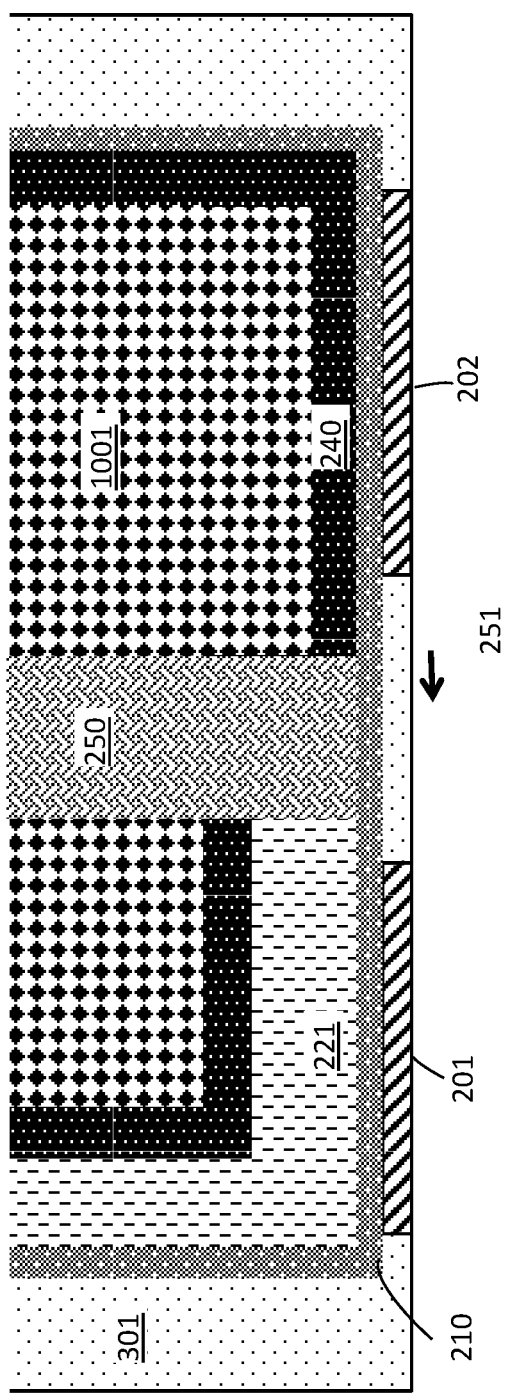

FIG. 17 is a cross-sectional side view after performing a planarization process. The planarization process may be, for example, a CMP process. The planarization process removes excess oxygen barrier material 250 from the surface of the conductive electrode material 1001 and polishes the surface of the conductive electrode material 1001 to form the final structure.

Like in the embodiment shown in FIG. 11, the oxygen absorbing barrier 250 separates the nFET 201 (first transistor) and the pFET 202 (second transistor). The oxygen absorbing separation barrier reduces oxygen diffusion from the pFET 202 to the nFET 201 (direction 251). However, in contrast to the first embodiment, the oxygen absorbing barrier 250 is confined to the region between the nFET 201 and the pFET 202. In the second embodiment, the oxygen absorbing barrier extends form the surface of the conductive electrode material 1001 to the high-k dielectric 210 between the nFET 201 and the pFET 202.

Figure 18:
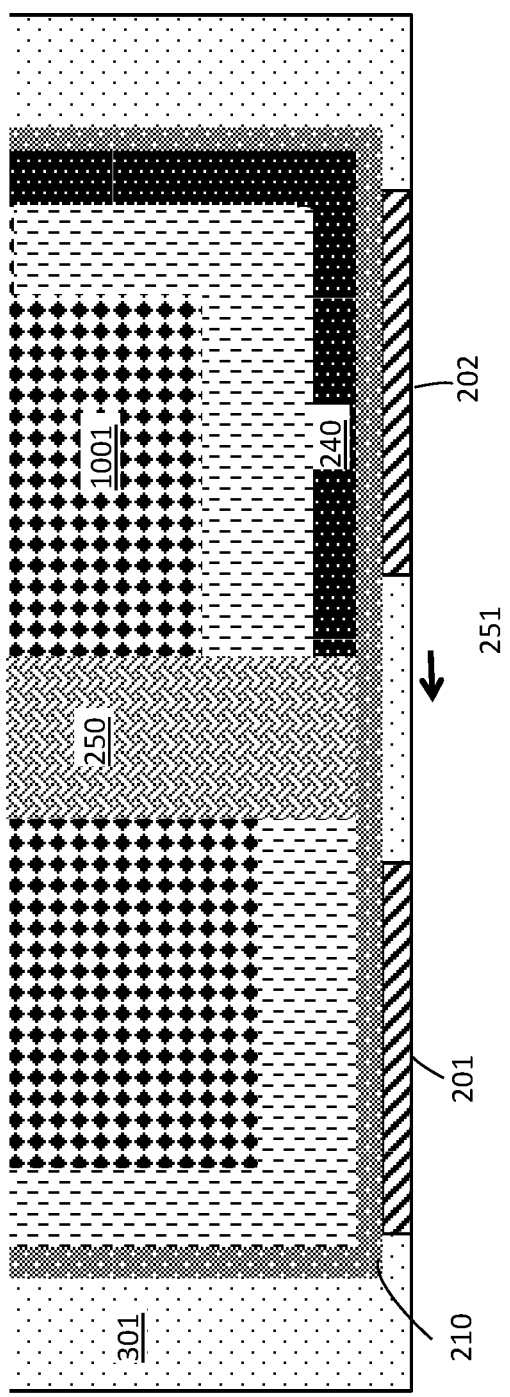
FIG. 18 is a cross-sectional side view of a semiconductor device according to another embodiment.

FIG. 18 is a cross-sectional side view of a semiconductor device according to another embodiment. Instead of depositing the nFET metal gate 221 before the pFET metal gate 240, the pFET metal gate 240 is first deposited and removed from the nFET side. Then the nFET metal gate 221 is deposited on the pFET metal gate 240 before forming the oxygen absorbing barrier.

As described above, various embodiments described herein provide semiconductor devices and methods of making semiconductor devices that suppress work function effects between transistors when a replacement metal gate scheme is used. A boundary is patterned and formed between an nFET and a pFET. The boundary includes a mild oxygen absorber that reduces the oxygen concentration difference between the nFET and the pFET.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
    forming a first transistor channel region of a first transistor and a second transistor channel region of a second transistor on a substrate;
    depositing a high-k dielectric layer on the first transistor channel region and the second transistor channel region, the high-k dielectric layer extending continuously over the first transistor channel region and the second transistor channel region;
    forming a first transistor metal gate stack directly on the high-k dielectric on the first transistor;
    forming a second transistor metal gate stack directly on the high-k dielectric on the second transistor, with a portion of the second transistor metal gate stack arranged directly on the first transistor metal gate stack;
    depositing an oxygen absorbing barrier layer directly on the high-k dielectric layer extending continuously between the first transistor metal gate stack and the second transistor metal gate stack, the oxygen absorbing barrier layer positioned in direct contact with the high-k dielectric between the first transistor metal gate stack and the second transistor metal gate stack, the oxygen absorbing barrier layer extending continuously from the high-k dielectric layer to a top surface of the portion of the second transistor metal gate stack arranged directly on the first transistor metal gate stack; and
    depositing a conductive electrode material on the first transistor and the second transistor such that the conductive electrode material covers the first transistor metal gate stack and the second transistor metal gate stack.

2. The method of claim 1, wherein the first transistor is an nFET, and the second transistor is a pFET.

3. The method of claim 1, further comprising depositing a sacrificial material on the first transistor metal gate and the second transistor metal gate after forming the second transistor metal gate; forming an opening in the sacrificial material between the first transistor and the second transistor; and removing the first transistor metal gate and the second transistor metal gate beneath the opening to expose the high-k dielectric between the first transistor and the second transistor.

4. The method of claim 3, further comprising removing the sacrificial material and then depositing the oxygen absorbing barrier between the first transistor and the second transistor, wherein the oxygen absorbing barrier is also disposed on the second transistor gate stack on the first transistor and the second transistor.

5. The method of claim 1, wherein the oxygen absorbing barrier layer is TiN, TiC, TiN, TiC, TaC, Ti, Al, TiAl, W, Ni, Nb, NbAl or any combination thereof.

* * * * *